United States Patent
Montoriol et al.

(10) Patent No.: US 9,401,723 B2
(45) Date of Patent: Jul. 26, 2016

(54) XOR PHASE DETECTOR, PHASE-LOCKED LOOP, AND METHOD OF OPERATING A PLL

(71) Applicants: Gilles Montoriol, Plaisance du Touch (FR); Olivier Vincent Doare, La Savetat St Gilles (FR); Birama Goumballa, Larra (FR); Didier Salle, Toulouse (FR)

(72) Inventors: Gilles Montoriol, Plaisance du Touch (FR); Olivier Vincent Doare, La Savetat St Gilles (FR); Birama Goumballa, Larra (FR); Didier Salle, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/709,686

(22) Filed: May 12, 2015

(65) Prior Publication Data
US 2016/0173109 A1 Jun. 16, 2016

(30) Foreign Application Priority Data

Dec. 12, 2014 (WO) .................. PCT/IB2014/003117

(51) Int. Cl.
| H03L 7/06 | (2006.01) |
| H03L 7/097 | (2006.01) |
| H03L 7/093 | (2006.01) |
| H03L 7/095 | (2006.01) |

(52) U.S. Cl.
CPC ................ *H03L 7/097* (2013.01); *H03L 7/093* (2013.01); *H03L 7/095* (2013.01)

(58) Field of Classification Search
USPC .................................. 327/147–149, 156–158
See application file for complete search history.

(56) References Cited

U.S. PATENT DOCUMENTS

| 5,105,108 A * | 4/1992 | Ngo .................... H03K 5/133 327/158 |
| 6,211,747 B1 | 4/2001 | Trichet et al. |
| 6,878,492 B2 | 4/2005 | Takeuchi et al. |
| 6,989,718 B2 | 1/2006 | Pretl et al. |
| 7,755,404 B2 * | 7/2010 | Lin ....................... H03L 7/0812 327/149 |
| 8,205,182 B1 * | 6/2012 | Zlatanovici ........... G06F 17/505 703/16 |
| 8,305,155 B2 * | 11/2012 | Yamaguchi ............... H03L 7/08 327/156 |
| 8,994,460 B2 * | 3/2015 | Kesselring .............. H03L 7/085 331/1 A |
| 2010/0073221 A1 | 3/2010 | McEwan |
| 2011/0133796 A1 * | 6/2011 | Osada .................... H03L 7/0995 327/156 |
| 2011/0285575 A1 | 11/2011 | Landez et al. |
| 2012/0049910 A1 * | 3/2012 | Aoyama .................. H03L 7/089 327/156 |
| 2012/0109356 A1 * | 5/2012 | Kong ...................... H04L 7/033 700/121 |
| 2012/0146694 A1 * | 6/2012 | Korniienko ............... G06F 1/10 327/158 |

(Continued)

OTHER PUBLICATIONS

Hsieh et al.; "A 19 GHz CMOS Signal Generator for 77 GHz FMCW Radars"; IEEE Microwave and Wireless Components Letters; Mar. 12, 2014; pp. 339-341; vol. 24, Issue 5; IEEE.

(Continued)

*Primary Examiner* — Adam Houston
(74) *Attorney, Agent, or Firm* — Charlene R. Jacobsen (57) ABSTRACT

An XOR phase detector for a phase-locked loop PLL comprises an XOR gate which has an input for a periodic reference signal and another input connected to a frequency divider of the PLL. A level shifter has a level shifter input connected to an output of the XOR gate and a level shifter output connectable to a voltage-controlled oscillator VCO of the PLL. The level shifter is connectable between low and high voltage providers and has a high level and a low level. The level shifter is arranged to deliver at its output the high level or the low level depending on whether the voltage at the output of the XOR phase detector is low or high. The level shifter further has a setpoint input for setting the high level to a setpoint level.

14 Claims, 9 Drawing Sheets

(56) References Cited

U.S. PATENT DOCUMENTS

| | | | | |
|---|---|---|---|---|
| 2013/0169328 A1* | 7/2013 | Shibasaki | ............. | H03L 7/0814 327/156 |
| 2014/0139266 A1* | 5/2014 | Kenney | ................ | G01R 25/005 327/9 |
| 2014/0285238 A1* | 9/2014 | Matsumura | ............. | H03L 7/085 327/9 |
| 2015/0222280 A1* | 8/2015 | Allan | ...................... | H03L 7/083 327/157 |

OTHER PUBLICATIONS

Wu et al.; "A 56.4-to-63.4 GHz Multi-Rate All-Digital Fractional-N PLL for FMCW Radar Applications in 65 nm CMOS"; IEEE Journal of Solid-State Circuits; May 2014; pp. 1081-1096; vol. 49, No. 5; IEEE.

* cited by examiner

XOR PHASE DETECTOR, PHASE-LOCKED LOOP, AND METHOD OF OPERATING A PLL

CROSS REFERENCE TO RELATED APPLICATION(S)

The present application claims priority to International Patent Application No. PCT/IB2014/003117, entitled "XOR PHASE DETECTOR, PHASE-LOCKED LOOP, AND METHOD OF OPERATING A PLL," filed on Dec. 12, 2014, the entirety of which is herein incorporated by reference.

FIELD OF THE INVENTION

This invention relates to an XOR phase detector, a phase-locked loop (PLL), and a method of operating a PLL.

BACKGROUND OF THE INVENTION

Figure 1:
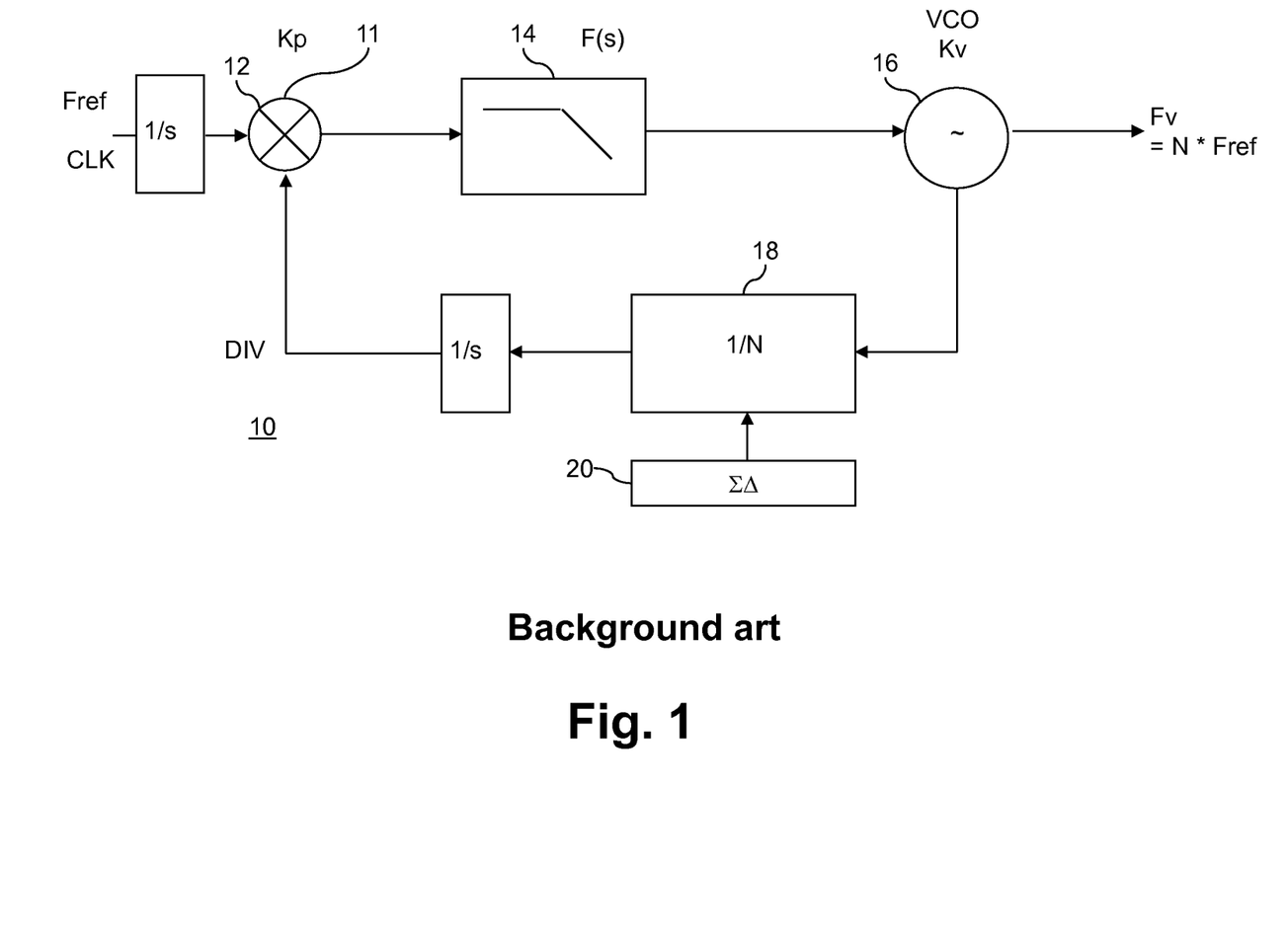
FIG. 1 schematically shows an example of an embodiment of a PLL.

FIG. 1 schematically shows an example of a phase-locked loop 10. The PLL 10 may comprise a phase detector 11, a low-pass filter 14, a voltage-controlled oscillator (VCO) 16, and a frequency divider 18. The phase detector 11 may have a first input connected or connectable to a reference signal provider (not shown), e.g., a clock which provides the phase detector 11 with a reference signal CLK that has a reference frequency Fref. The phase detector 11 may have second input connected to an output of the frequency divider 18. The low-pass filter 14 may have an input connected to an output of the phase detector 11. The VCO 16 may have an input connected to an output of the low-pass filter 14. The frequency divider 18 may have an input connected to an output of the VCO 16. In the example, the PLL further comprises a control unit, e.g., a sigma delta modulator 20, connected to the frequency divider 18 for controlling the division ratio of the frequency divider 18.

In operation, the phase detector 11 may compare a frequency divider output signal DIV from the frequency divider 18 against the reference signal CLK to determine a phase shift of the output signal from the frequency divider 18 relative to the reference signal CLK. A phase detection signal from the phase detector 11, indicative of the phase shift, may be passed through the low-pass filter 14 to filter out high frequency components from the phase detection signal. The filtered phase detection signal may be fed to the VCO 16, thus determining the oscillation frequency of the VCO 16. The VCO output signal, with frequency Fv, may be fed to the frequency divider 18 to generate the frequency divider output signal DIV of frequency Fv/N, N being the frequency division ratio of the frequency divider 18. Thus, a negative feedback loop for keeping the VCO phase-locked to the reference signal CLK may be provided.

The frequency division ratio N may be varied to generate frequency ramps of the VCO 16, i.e., ramps of the VCO frequency Fv. Frequency ramps are commonly used in radar applications, for example. In the example, frequency ramps may be generated by means of the sigma delta modulator 20.

Figure 2:
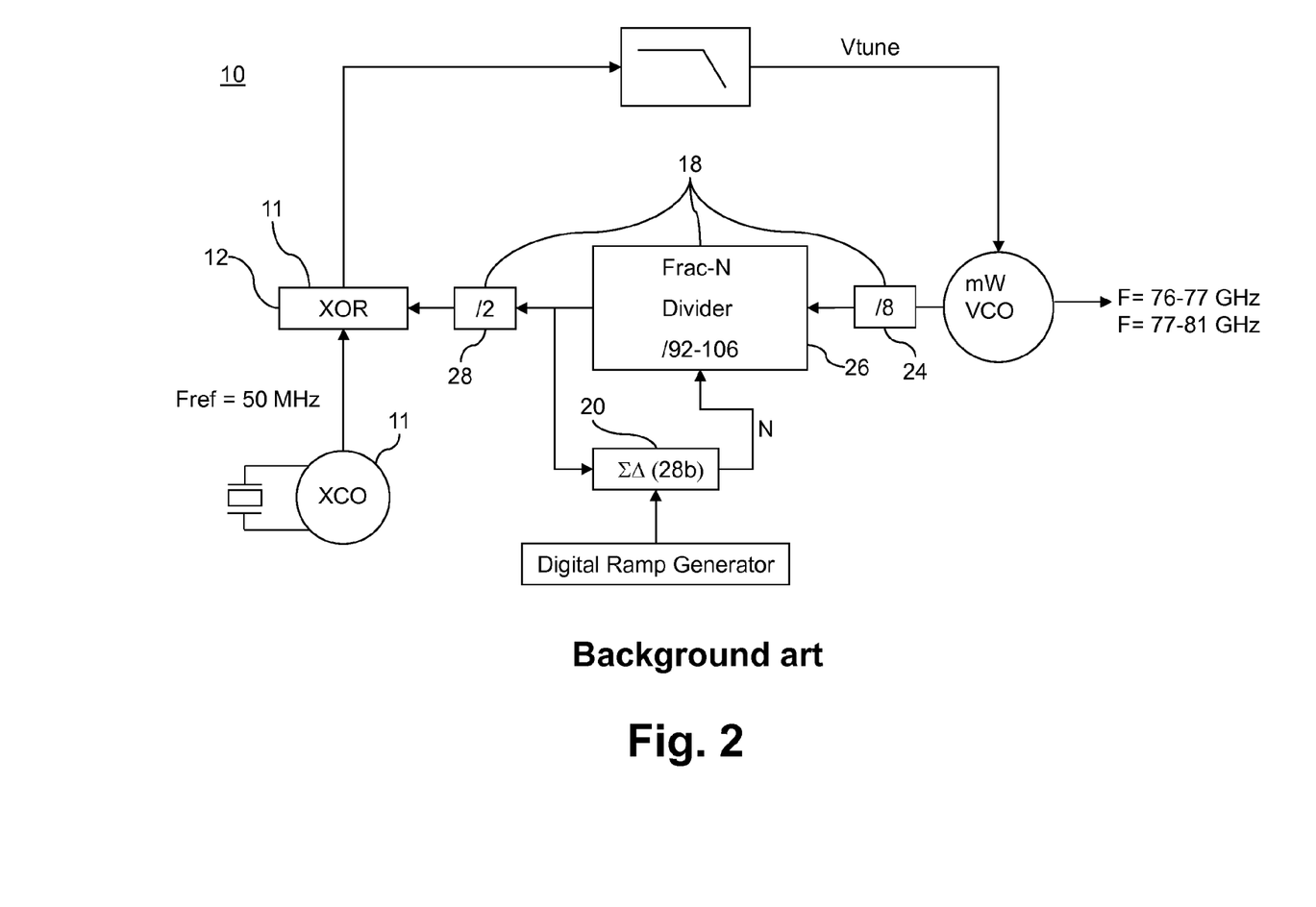
FIG. 2 schematically shows an example of an embodiment of a PLL.

FIG. 2 schematically illustrates an example of an embodiment of the PLL 10 shown in FIG. 1. The phase detector 11 may, for instance, comprise an XOR gate 12, and it may in this case be referred to as the XOR phase detector 11. An XOR phase detector may sometimes be preferred over a classic combination of a phase-frequency detector and a charge pump, e.g., when the PLL including the low pass filter 14 is to be implemented on a single chip. Lack of a charge pump can result in a lower level of noise.

The reference signal provider may, for example, be a crystal oscillator (XCO) 11. The frequency divider 18 may comprise a series of one or more frequency dividers, e.g., including at least a programmable fractional divider. In the example, the frequency divider 18 comprises a first divider 24, a second divider 26, and a third divider 28, with division ratios of, e.g., 8, N, and 2, respectively. The division ratio N may be a fractional number in the range of, e.g., 92 to 106. The division ratio N may be programmable by means of the sigma delta modulator 20. The sigma delta modulator 20 may be connected to the second frequency divider 26 in a negative feedback loop. The PLL 10 may further comprise a ramp generator 22, e.g., a digital ramp generator, connected to the sigma delta modulator 20 so as to define the division ratio N of the second frequency divider 26, e.g., in a time-dependent manner.

Figure 3:
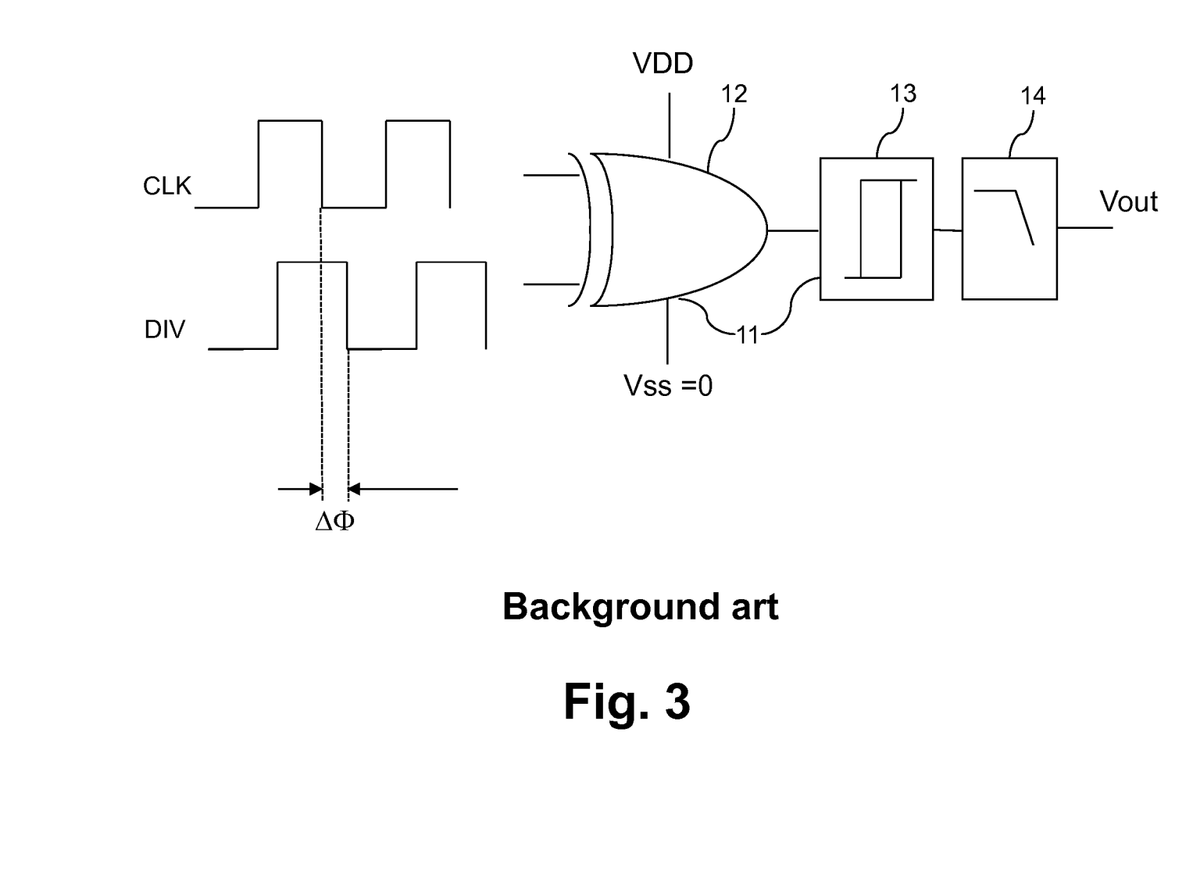
FIG. 3 schematically shows an example of an embodiment of a signal line comprising an XOR phase detector and a low-pass filter.
Figure 4:
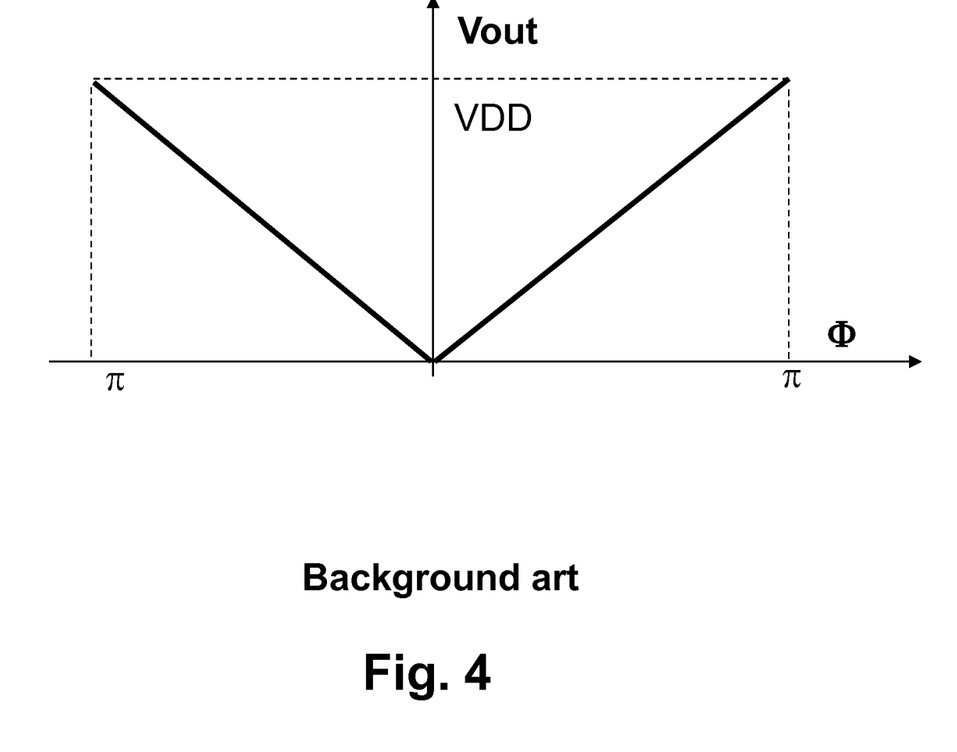
FIG. 4 shows a diagram of the output voltage of an XOR phase detector.

FIG. 3 schematically illustrates an example of the phase detector 11 and operation thereof. In the example, the phase detector 11 is an XOR phase detector comprising an XOR gate 12 and a level shifter 13. The XOR gate 13 may have a first input, a second input, and an output. The output of the XOR gate 12 may be connected to the low-pass filter 14 via the level shifter 13. The XOR gate 12 may be arranged such that its output is low when its inputs are both low or both high, and high when one of its inputs is low and the other one is high. Accordingly, in the time interval indicated as delta Φ in the Figure, the XOR output may be high. When the two input signals are in phase, ΔΦ is 0. The output of an XOR frequency detector is schematically illustrated as a function of the phase shift ΔΦ in FIG. 4. It is noted that the XOR may be incapable of discriminating between a positive and a negative phase shift ΔΦ.

SUMMARY OF THE INVENTION

The present invention provides an XOR phase detector, a PLL, and a method of operating a PLL as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

FIGS. 5 to 9 schematically illustrate various examples of embodiments of an XOR phase detector 11 for a PLL 10. The XOR phase detector 11 may comprise an XOR gate 12 which has a first input for receiving a periodic reference signal and a second input connected or connectable to an output of a frequency divider 18 of the PLL 10. The XOR phase detector 11 may further comprise a level shifter 13 which has a level shifter input connected to an output of the XOR gate 12 and a level shifter output connected or connectable to a voltage-controlled oscillator VCO 16 of the PLL 10. The level shifter 13 may be connected or connectable between a low voltage provider 38 and a high voltage provider 40 and may have a high level and a low level associated with it. The level shifter 13 may be arranged to deliver at its output the high level or the low level depending on whether the voltage at the output of the XOR phase detector 11 is low or high. The level shifter 13 further has a setpoint input for setting the high level to a setpoint level, e.g., as a function of the operating frequency of the PLL 10. The high level can thus be varied so as adapt the high level to the operating frequency of the PLL 10 or to a range of operating frequencies.

The gain of the phase detector 11 can thus be modulated, e.g., so as to compensate for non-linear characteristics of the VCO 16, thus reducing the variation of the loop gain. It may be possible to achieve a substantially constant loop gain, a substantially constant loop bandwidth, and stability over the VCO tuning range.

Figure 5:
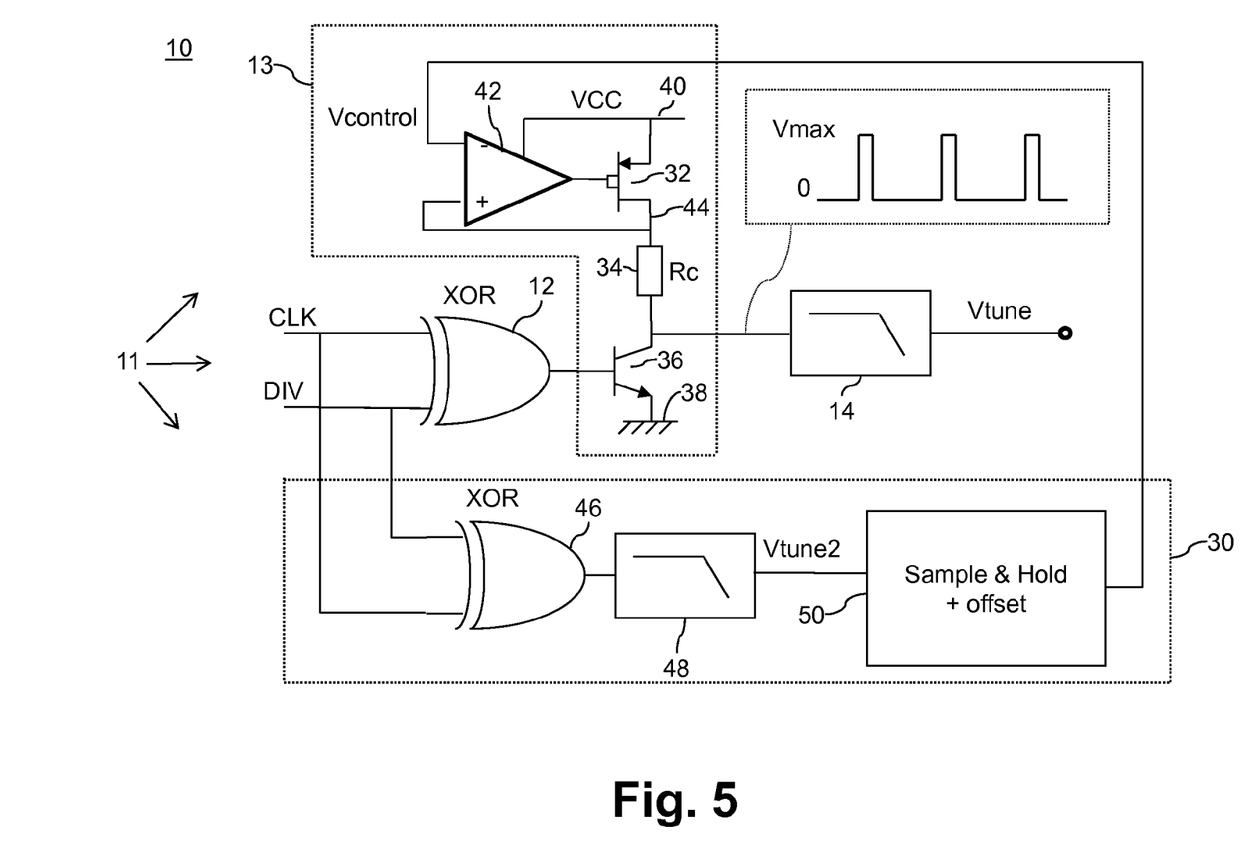
FIG. 5 schematically shows an example of an embodiment of a phase detector having a variable transfer function.
Figure 6:
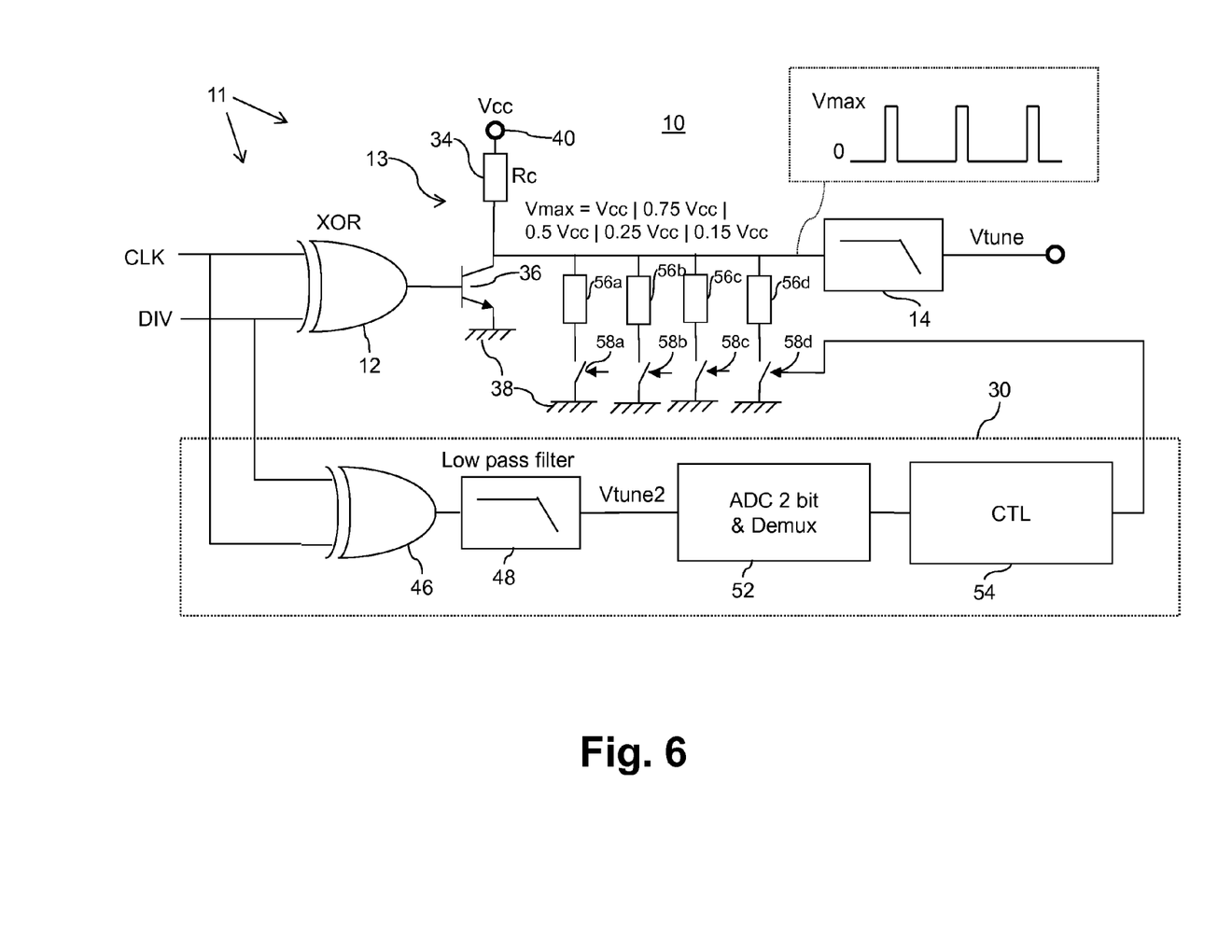
FIG. 6 schematically shows an example of an embodiment of a phase detector having a transfer function varying by steps.
Figure 8:
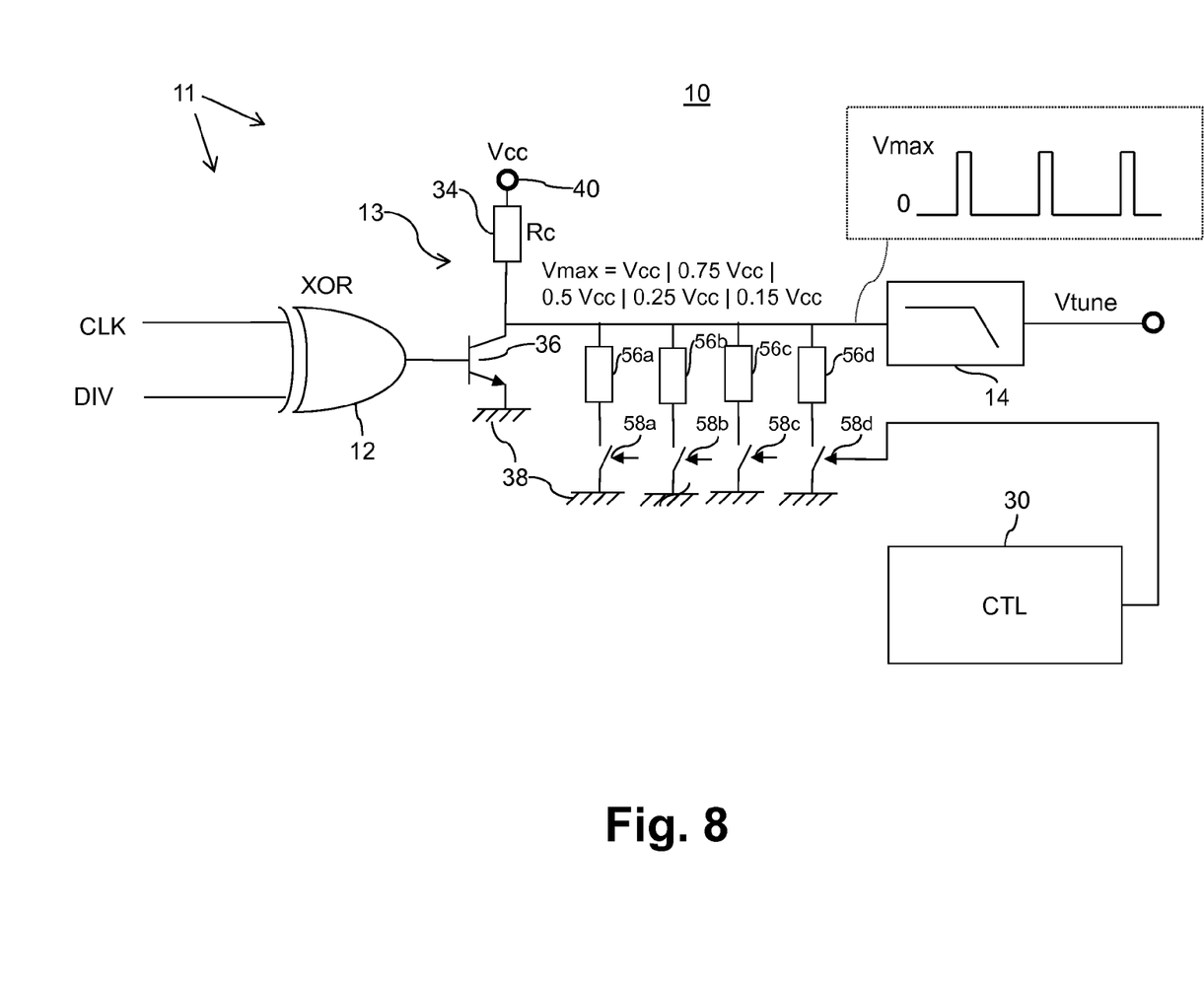
FIG. 8 schematically shows an example of an embodiment of a PLL comprising a phase detector with a variable transfer function.

For example, the XOR phase detector 11 may comprise a memory element 31 for memorizing the setpoint level (see FIGS. 5, 6, and 8). The setpoint input of the level shifter 13 may be connected to an output of the memory element 31 so as to receive the setpoint level from the memory element. In one example, the XOR phase detector 11 comprises a level shift control unit 30 which comprises the memory element 31 and which is arranged to set the setpoint level in the memory element 30 in an initialization phase. The initialization phase may be prescribed, for instance, by a program residing in the level shift control unit 30. The program may be softcoded or hardcoded.

The initialization phase may comprise, for example: locking the PLL 10 at a first level of a tuning voltage Vtune of the VCO; and setting the setpoint level on the basis of or in accordance with said first level of the tuning voltage Vtune of the VCO. For instance, the setpoint level may be set in accordance with a linearly increasing function of the tuning voltage Vtune. It is expected that the frequency-dependency of the loop gain can be substantially reduced in this manner. The initialization phase may further comprise increasing the setpoint level in response to detecting that the PLL does not lock. In one example, the level shift control unit 30 has a sequence of one or more different candidate levels programmed in it and the initialization phase comprises: setting the setpoint level to the first candidate level of the sequence and repeating the following cycle, starting with the first candidate level of the sequence and terminating when the PLL 10 has locked or when the set of candidate levels is exhausted; detecting whether the PLL 10 has locked; and in response to detecting that the PLL has not locked, setting the setpoint level to the next candidate level of the sequence.

The level shifter 13 may comprise a resistor 34 connected between the high voltage provider 40 and the level shifter output, and a switch 36 connected between the low voltage provider 38 and the level shifter output and which has a switch control input which is connected to or acts as the level shifter input.

In one example, the switch 36 comprises a bipolar junction transistor (BJT). The BJT may have an emitter connected to the low voltage provider, a collector connected to a low-side terminal of the resistor, and a base connected to the output of the XOR gate 12 phase detector. In another example, the switch 36 comprises a metal oxide semiconductor field-effect transistor (MOSFET). The MOSFET may have a source connected to the low voltage provider, a drain connected to a low-side terminal of the resistor, and a gate connected to the output of the XOR gate 12. The level shifter 13 may further comprise one or more pull-down branches. Each pull-down branch may be connected between the level shifter output and the low voltage provider 38. The setpoint level of the level shifter 13 can thus be adjusted by turning one or more of the pull-down branches on and the other ones off. For example, each of the pull-down branches may comprises a switch (e.g., one of the switches 56a, 56b, 56c, 56d in FIGS. 6 and 8) and a resistor (e.g., one of the resistors 58a, 58b, 58c, 58d in FIGS. 6 and 8) connected in series, wherein the switch has a switch control input connected to the setpoint input.

In another example, the level shifter 13 comprises a regulator 32 connected between the resistor 34 and the high voltage provider 40. As shown in FIG. 5, the regulator 32 may be operated to drive the high-side terminal of the resistor 34 to a voltage lower than that of the high voltage provider 40 as a function of the setpoint level.

In the example of FIG. 5, the level shifter 13 is arranged to be controlled by means of a level shift control signal, e.g., by a level shift control voltage. A peak level Vmax of the voltage output by the level shifter 13 can thus be adjusted to, e.g., the frequency of the PLL. It is noted that in typical operation of the PLL, when the PLL has locked, the phase shift detected by the XOR gate12 translates into the width of the pulses output by the level shifter 13. The tuning voltage Vtune fed to the VCO 16 (not shown in FIG. 5), i.e., the output from the loop filter 14 may be substantially a time average of the output signal from the level shifter 13. The oscillation frequency of the VCO 16 may be increased by increasing the tuning voltage Vtune, which requires an increase of the phase shift ΔΦ or an increase of the peak level of the output signal from the level shifter 13, or both. Clearly, in order to achieve a certain oscillation frequency of the VCO 16, a minimum peak level of the output signal from the level shifter 13 may be necessary, and this minimum required peak level tends to be higher for higher oscillation frequencies. On the other hand, when the oscillation frequency is low, a large peak level of the output signal from the level shifter 13 may require a very short phase shift ΔΦ and, accordingly, very narrow pulses of the output signal from the level shifter 13. This may generate undesired phase noise and may be a sign that the PLL loop gain is high. It may therefore be beneficial to operate the level shifter 13 so as to adapt the peak level Vmax of its output voltage to the oscillation frequency of the VCO 16, or to a certain range of oscillation frequencies.

In the example, the XOR phase detector 11 comprises, in addition to the XOR gate 12 and the level shifter 13, a level shift control unit 30 connected to the level shifter 13. The level shift control unit 30 may be arranged to provide a control voltage Vcontrol to the level shifter 13. The level shifter 13 may, for instance, comprise a regulator 32, e.g., a MOSFET, in series with a resistor 34 and a bipolar junction transistor (BJT) 36. The regulator 32, the resistor 34, and the BJT 36 may, for instance, be connected in series between a low voltage provider 38 and a high voltage provider 40. The low voltage provider 38 may provide a voltage which is low in the sense that it is lower than the voltage at the high voltage provider 40. The voltage provided by the high voltage provider 40 may be high in the sense that it is higher than the voltage provided by the low voltage provider 38. The low and high voltage providers 38, 40 may, for instance, be connected or connectable to the terminals of a DC power supply such as an AC to DC power converter or a battery. The BJT 36 may have a collector connected to the resistor 34 and to the input of the loop filter 14 and an emitter connected to the low voltage provider 38. The BJT 36 may have a base connected to the output of the XOR gate 12. The level shifter 13 may further comprise an operational amplifier 42 connected in a negative feedback configuration for controlling the regulator 32 so as to drive the voltage at a node 44 to the control voltage Vcontrol from the level shift control circuit 30. The node 44 may be a node connected between the regulator 32 and the resistor 34, for example. It is noted that the level shifter 13 may be implemented differently but equivalently.

The level shift control unit 30 may be arranged to memorize a value representative of the control voltage Vcontrol so as to maintain the control voltage Vcontrol substantially constant during operation of the PLL 10 until the memorized value is updated. For example, the level shift control unit 30 may be operated to set the control voltage Vcontrol to a first level during a first operating phase in which the PLL is operated in a first frequency range. At a later time, the level shift control unit 30 may be operated to set the control voltage Vcontrol to a new level higher than the previous level for operating the phase detector 11 in a higher frequency range.

In the example, the level shift control unit 30 may comprise an XOR gate 46, a low-pass filter 48, and a sample and hold unit 50. The XOR gate 46 may have a first input and a second input connected to the first input and the second input of the XOR gate 12, respectively. The low-pass filter 48 may have an input connected to the output of the XOR gate 46. The sample and hold unit 50 may have an input connected to an output of the low-pass filter 48. The low-pass filter 48 may thus provide a dummy tuning voltage Vtune2 which may be considered a replica or image of the output voltage Vtune of the loop filter 14. The sample and hold unit 50 may be operable to sample and hold the dummy tuning voltage Vtune2 and to translate it into a corresponding control voltage Vcontrol. Thus, by sampling and holding Vtune2, the control voltage Vcontrol may be set to a level in accordance with the tuning voltage Vtune that may be fed to the VCO 16, e.g., in proportion to the tuning voltage Vtune. The peak level Vmax of the output voltage of the level shifter 30. i.e., the voltage which may be applied at the loop filter 13, may be fixed in accordance with Vtune, e.g., in proportion to Vtune. Operation of the PLL can thus be optimized individually for different frequency ranges.

FIG. 6 schematically illustrates an example of an embodiment of the PLL 10 in which the level shifter 13 and the level shift control unit 30 are implemented differently when compared to FIG. 5. As shown in FIG. 6, the level shifter 13 may comprise a resistor 34 and a BJT 36 connected in series between the low voltage provider 38 and the high voltage provider 40. The BJT 36 may have its emitter connected to the low voltage provider 38, its collector connected to the resistor 34 and to the loop filter 14, and its base to the XOR gate 12. As in FIG. 5, the XOR gate 12 may open and close the BJT 36 to generate a pulsed signal. The pulsed signal may have a pulse width substantially identical to the detected phase shift ΔΦ. The pulsed signal may be fed to the loop filter 14. Also, as described above in reference to FIG. 5, the level shifter output signal, i.e., the pulsed signal fed to the loop filter 14, may have a peak level of Vmax (as schematically illustrated in the inlet figure of FIG. 6) which may be constant during normal operation of the PLL 10 and which may be adapted, in a configuration procedure, to the frequency range for which the XOR phase detector 11 is intended to be used.

In the example, the level shifter 13 may comprise a set of controllable pull-down paths 56a, 58a to 56d, 58d which may be controlled by the level shift control unit 30 so as to adapt the peak level Vmax of the signal provided to the loop filter 14. Each of the pull-down paths 56a, 58a to 56d, 58d may be connected between the output of the level shifter 13, e.g., the collector of the BJT 36, and a low voltage provider, e.g., the low voltage provider 38. Each of the pull-down paths 56a, 58a to 56d, 58d may, for example, comprise a resistor 56a, 56b, 56c, and 56d, respectively, and a switch 58a, 58b, 58c, and 58d connected in series with the respective switch.

In one example, the level shift control unit 30 may be arranged to activate one of the pull-down paths 56a, 58a to 56d, 58d and to deactivate the others, thus providing a conductive path from the high voltage provider, e.g., via the resistor 34, to the low voltage provider 38. More specifically, the level shift control unit 30 may be operable to close, i.e., to turn on, a selected one of the switches 58a to 58d and to open, i.e., to turn off, the remaining ones of the switches 58a to 58d. The effect of activating one of the pull-down paths 56a, 58a to 56d, 58d may be that of lowering the voltage at the output of the level shifter 13 or, equivalently, an amplitude reduction of the signal fed to the loop filter 14. Each of the resistors 56a to 56d may have a resistance different from each of the other ones of the resistors 56a to 56d. The peak level Vmax of the level shifter output signal may thus be set to different values.

For example, when none of the switches 58a to 58d is closed, the peak level Vmax may be Vcc, which is the voltage at the high voltage provider 40. The individual resistances of the resistors 56a to 56d may, for example, be such that selecting the first pull-down path 56a, 58a or the second pull-down path 56b, 58b or the third pull-down path 56c, 58c or the fourth pull-down path 56d, 58d may set the peak level Vmax to a value of 0.75 Vcc, 0.5 Vcc, 0.25 Vcc, and 0.15 Vcc, respectively.

Pull-down paths from the output of the level shifter 13 to the low voltage provider, e.g., the low voltage provider 38, may be implemented in any appropriate manner similar to or different from the one shown in FIG. 6. For example, in a variant of the present scheme, several switches, e.g., switches 58a and 58b, may be closed simultaneously, e.g., to set the peak level Vmax of the level shifter output to a level that cannot be obtained by closing only one of the switches 58a to 58d. Also, the level shifter 13 may comprise fewer or more than the four pull-down paths 56a, 58a to 56d, 58d of the example.

The level shifter unit 30 may be operable to set the peak level Vmax of the level shifter output signal as a function of the tuning voltage Vtune, i.e., the output voltage of the loop filter 14 or in dependence of a dummy tuning voltage Vtune2 correlated to Vtune, e.g., in a way similar to the one described above in reference to FIG. 5. For instance, the level shift control unit 30 may comprise an XOR gate 46 having a first input and a second input connected to the first and second inputs of the XOR gate 12, respectively, and an output connected to a low-pass filter 40 so as to generate the dummy voltage Vtune2. Vtune2 may behave similarly to Vtune, i.e., Vtune2 may be considered a replica or an image of Vtune.

However, it should be pointed out that Vtune2 is not derived from Vtune but generated in parallel with Vtune, e.g., on the basis of the reference signal CLK and the divider output signal DIV from the frequency divider 18. It may thus be ensured that the level shift control unit 30 adds little or no noise to the tuning voltage Vtune.

The level shift control unit 30 may further comprise an analog to digital converter (ADC) 52 and a control unit 54. The ADC 52 may have an input connected to the low-pass filter 48. The control unit 54 may have an input connected to an output of the ADC 52. The control unit 54 may be configured, e.g., programmed or hard coded, to control the level shifter 13 so as to set the peak level Vmax in dependence on a sampled value of the dummy tuning voltage Vtune2.

Figure 7:
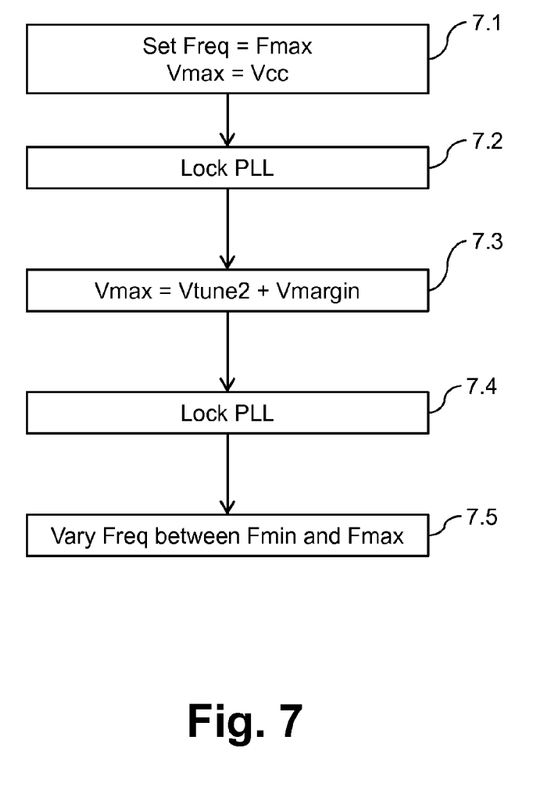
FIG. 7 shows a flow chart of an example of an embodiment of a method of operating a PLL.

An example of a method of operating a phase detector 11, e.g., in one of the PLLs described above with reference to FIGS. 5 and 6, is schematically illustrated by the flow chart in FIG. 7. The method may start, for example, with setting the operating frequency Freq, to a maximum frequency Fmax (7.1), and configuring the level shifter 13 to provide a high peak voltage Vmax, e.g., by selecting a highest possible level of the peak voltage Vmax, e.g., Vmax=Vcc. Fmax may be the upper limit of a frequency range in which the phase detector 11 is intended to be operated. The PLL may thus be placed into a test configuration. In the test configuration, the phase detector 11 may then be operated until it has locked (7.2), i.e., until the tuning voltage Vtune has settled. The tuning voltage Vtune or a dummy tuning voltage, e.g., Vtune2, may then be sampled, and the level shifter 13 may be reconfigured to set the peak level Vmax of its output voltage to a level on the basis of the sampled value of the tuning voltage Vtune or on the basis of the sampled value of the dummy tuning voltage, e.g., Vtune2 (7.3). For example, Vmax may be set to the sampled level of Vtune2 plus a non-zero safety margin Vmargin. The phase detector 11 may then again be operated normally. When the PLL 10 has locked (7.4), the operating frequency Freq may, for instance, be kept constant or it may be varied (7.5), e.g., in a range from a minimum frequency Fmin and said maximum frequency Fmax. For instance, frequency ramps from Fmin to Fmax may be performed. If, however, the PLL does not lock, the peak level Vmax may be set to a higher level, e.g., Vcc/2. The peak level Vmax may be increased successively in a step-wise manner until the PLL locks or until a highest possible level (e.g., Vcc) is reached.

FIG. 8 schematically illustrates an example of another embodiment of a phase detector 11. The phase detector 11 of FIG. 8 may differ from the one in FIG. 6 in the design of the level shift control unit 30. In the example, the level shift control unit 30, i.e., the unit for controlling the peak level Vmax of the level shifter output signal, may be arranged to operate without relying on feedback from the rest of the phase detector 11 and, notably, without sensing the tuning voltage Vtune or a dummy tuning voltage Vtune2. Instead, the level shift control unit 30 may be configurable, e.g., by a user, to set the peak level to a desired level. The phase detector 11 can thus be configured for a desired frequency range.

Figure 9:
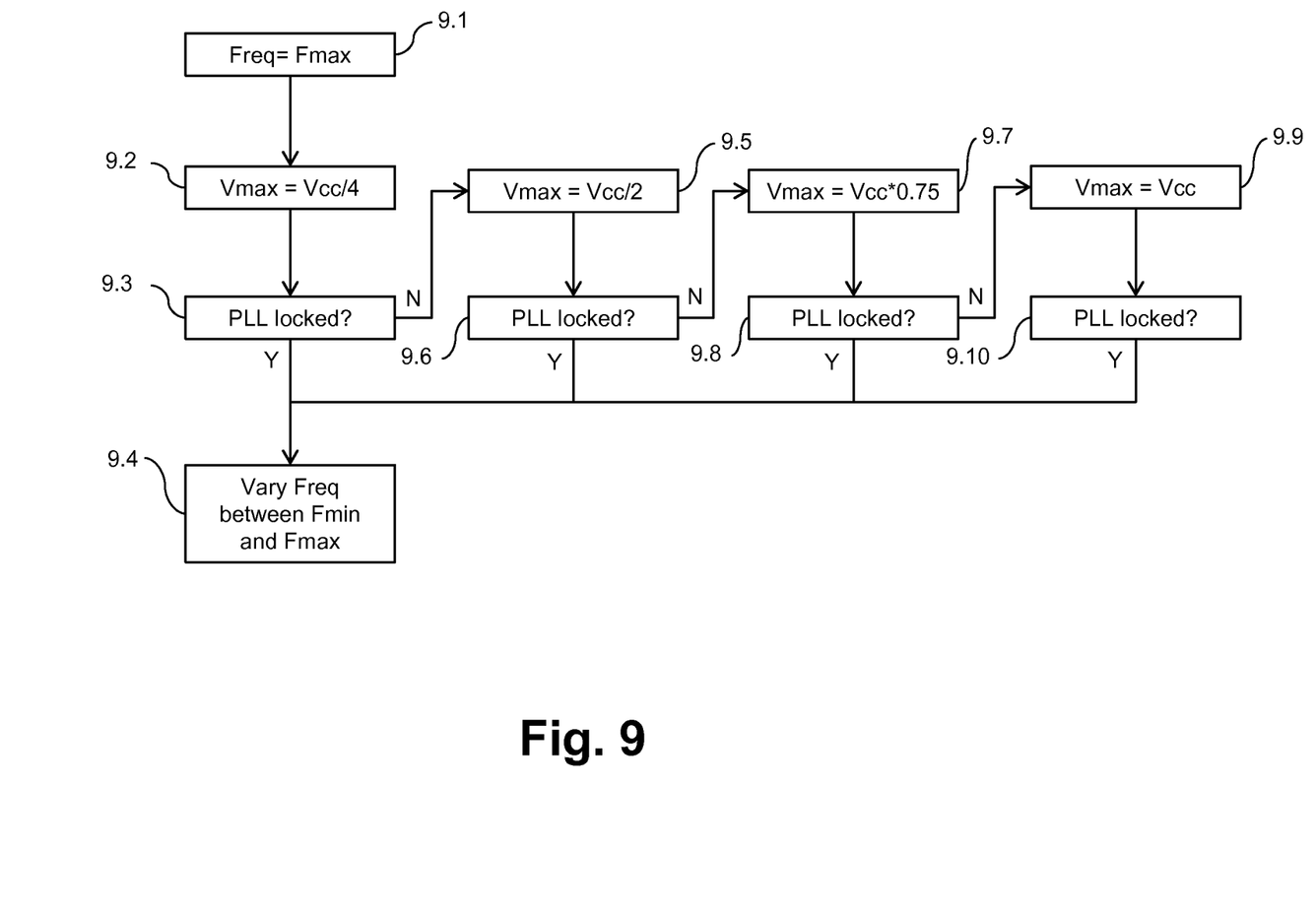
FIG. 9 shows a flow chart of an example of an embodiment of a method of operating a PLL comprising a variable transfer function phase detector.

The flow chart in FIG. 9 schematically illustrates an example of a method of configuring the level shifter 13 in a phase detector, e.g., the phase detector 11 described in reference to FIG. 8. The method may start with setting the operating frequency Freq to a test frequency Fmax (9.1). The test frequency Fmax may, for example, be the maximum frequency of a frequency range for which the PLL is intended. The method may further comprise a procedure for detecting a minimum peak voltage Vmax at which the PLL 10 will lock. The procedure may comprise, e.g., setting the peak voltage to a first trial level (first candidate level), e.g., Vmax=Vcc/4 (9.2) and detecting whether the PLL locks (9.3). If the PLL has locked, the first trial level may be accepted as the minimum peak voltage Vmax for normal operation of the PLL, and the method may proceed with operating the PLL normally (9.4). Normal operation of the PLL may comprise, for example, performing frequency ramps over a frequency range from a minimum frequency Fmin to the maximum frequency Fmax. If, however, the PLL does not lock (9.3), further trial levels (candidate levels) may be tested (9.5 to 9.10) until the PLL has locked or until the set of trial levels is exhausted. In the example, the set of trial levels comprises the four levels Vcc/4, Vcc/2, Vcc*0.75, and Vcc. The set of trial levels may comprise fewer or more trial levels than in the shown example.

In the foregoing specification, the invention has been described with reference to specific examples of embodiments of the invention. It will, however, be evident that various modifications and changes may be made therein without departing from the broader spirit and scope of the invention as set forth in the appended claims.

A resistor may be any resistive element. For example, a resistor may comprise a network of several resistive elements. Similarly, a capacitor may be any capacitive element. A capacitor may comprise a network of several capacitive elements.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the switches 58*a* to 58*d* may be located in the level shift control unit 30 instead of the level shifter 13, the sigma delta modulator 20 may be considered part of the frequency divider 18, and the ADC 52 may be integrated in the control unit 54.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. For example, the operations of driving Freq to Fmax and Vmax to Vcc described in reference to FIG. 7 may be carried out successively as well as overlapping in time.

Also for example, in one embodiment, the illustrated examples may be implemented as circuitry located on a single integrated circuit or within a same device. For example, the components 12 to 20 shown in FIG. 1 may be located on a single IC. Alternatively, the examples may be implemented as any number of separate integrated circuits or separate devices interconnected with each other in a suitable manner. For example, the components 12 to 20 in FIG. 1 may be implemented as separate interconnected devices which are not located on an integrated circuit.

Also for example, the examples, or portions thereof, may be implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An XOR phase detector for a phase-locked loop PLL, comprising:
   an XOR gate which has a first input for receiving a periodic reference signal and a second input connected or connectable to an output of a frequency divider of the PLL, and
   a level shifter which has a level shifter input connected to an output of the XOR gate and a level shifter output connected or connectable to a voltage-controlled oscillator VCO of the PLL, wherein the level shifter is connected or connectable between a low voltage provider and a high voltage provider and has associated with it a high level and a low level and is arranged to deliver at its output the high level or the low level depending on whether the voltage at the output of the XOR phase detector is low or high,
   wherein the level shifter further has a setpoint input for setting the high level to a setpoint level.

2. The XOR phase detector of claim 1, comprising a memory element for memorizing the setpoint level, wherein the setpoint input of the level shifter is connected to an output of the memory element so as to receive the setpoint level from the memory element.

3. The XOR phase detector of claim 2, comprising a level shift control unit which comprises said memory element and which is arranged to set the setpoint level in the memory element in an initialization phase.

4. The XOR phase detector of claim 3, wherein the initialization phase comprises:
   locking the PLL at a first level of a tuning voltage Vtune of the VCO;
   setting the setpoint level on the basis of or in accordance with said first level of the tuning voltage Vtune of the VCO.

5. The XOR phase detector of claim 4, wherein said act of setting the setpoint level on the basis of or in accordance with said first level of the tuning voltage Vtune of the VCO comprises:
   setting the setpoint level in accordance with a linearly increasing function of the tuning voltage Vtune.

6. The XOR phase detector of claim 3, wherein the initialization phase comprises:
   increasing the setpoint level in response to detecting that the PLL does not lock.

7. The XOR phase detector of claim 6, wherein the level shift control unit has a sequence of one or more different candidate levels programmed in it and the initialization phase comprises setting the setpoint level to the first candidate level of the sequence and repeating the following cycle, starting with the first candidate level of the sequence and terminating when the PLL has locked or when the set of candidate levels is exhausted:
   detecting whether the PLL has locked;
   in response to detecting that the PLL has not locked, setting the setpoint level to the next candidate level of the sequence.

8. The XOR phase detector of claim 1, wherein the level shifter comprises:
   a resistor connected between the high voltage provider and the level shifter output; and
   a switch connected between the low voltage provider and the level shifter output and having a switch control input which is connected to or acts as the level shifter input.

9. The XOR phase detector of claim 8, wherein the switch comprises a bipolar junction transistor BJT, the BJT having an emitter connected to the low voltage provider, a collector connected to a low-side terminal of the resistor, and a base connected to the output of the XOR gate, or wherein the switch comprises a metal oxide semiconductor field-effect transistor (MOSFET) having a source connected to the low voltage provider, a drain connected to a low-side terminal of the resistor, and a gate connected to the output of the XOR gate.

10. The XOR phase detector of claim 9, wherein the level shifter comprises one or more pull-down branches, wherein each of said pull-down branches is connected between the level shifter output and the low voltage provider.

11. The XOR phase detector of claim 10, wherein each of said pull-down branches comprises a switch and a resistor connected in series, wherein the switch has a switch control input connected to the setpoint input.

12. The XOR phase detector of claim 8, wherein the level shifter comprises a regulator connected between the resistor and the high voltage provider and arranged to drive the high-side terminal of the resistor to a voltage lower than that of the high voltage provider as a function of the setpoint level.

13. A phase-locked loop PLL, comprising a voltage-controlled oscillator VCO, a frequency divider, an XOR phase detector, and a low-pass filter;

wherein the frequency divider has an input connected to an output of the VCO, the XOR phase detector comprises an XOR gate and a level shifter, the XOR gate has a first input for receiving a periodic reference signal and a second input connected to an output of the frequency divider, the level shifter has a level shifter input connected to an output of the XOR gate, the low-pass filter has an input connected to an output of the XOR phase detector, and the VCO has an input connected to an output of the low-pass filter, wherein the level shifter is connected or connectable between a low voltage provider and a high voltage provider and has associated with it a high level and a low level and is arranged to deliver at its output the high level or the low level depending on whether the voltage at the output of the XOR gate is low or high, wherein the level shifter further has a setpoint input for setting the high level to a setpoint level.

14. A method of operating an XOR phase detector in a phase-locked loop PLL, the PLL comprising a voltage-controlled oscillator VCO, a frequency divider, the XOR phase detector, and a low-pass filter;

wherein the frequency divider has an input connected to an output of the VCO, the XOR phase detector comprises an XOR gate and a level shifter, the XOR gate has a first input receiving a periodic reference signal and a second input connected to an output of the frequency divider, the level shifter has a level shifter input connected to an output of the XOR gate, the low-pass filter has an input connected to an output of the XOR phase detector, and the VCO has an input connected to an output of the low-pass filter, wherein the level shifter is connected between a low voltage provider and a high voltage provider and has associated with it a high level and a low level and delivers at its output the high level or the low level depending on whether the voltage at the output of the XOR gate is low or high, wherein the method comprises: varying the high level so as to adapt the high level to an operating frequency of the PLL or to a range of operating frequencies of the PLL.

* * * * *